(12) United States Patent
Auer

(10) Patent No.: US 6,400,569 B1
(45) Date of Patent: Jun. 4, 2002

(54) HEAT DISSIPATION IN LEAD FRAMES

(75) Inventor: Carl Auer, Mesa, AZ (US)

(73) Assignee: Composidie, Inc., Apollo, PA (US)

( * ) Notice: Subject to any disclaimer, the term of this patent is extended or adjusted under 35 U.S.C. 154(b) by 0 days.

(21) Appl. No.: 08/896,861

(22) Filed: Jul. 18, 1997

(51) Int. Cl.[7] ................................................. H05K 7/20
(52) U.S. Cl. ........................ 361/704; 361/707; 361/719; 361/723; 361/762; 257/666; 257/678; 257/713; 174/16.3; 29/827
(58) Field of Search .............................. 361/704–710, 361/717–720, 723, 762, 713, 813; 257/666, 670, 678, 669, 675, 693, 676, 713–726; 174/16.3, 52.3, 52.4, 52.2, 252, 17.08; 29/827, 832, 593, 843, 830, 855, 877; 216/11, 17

(56) References Cited

U.S. PATENT DOCUMENTS 3,778,887 A * 12/1973 Suzuki et al. ................. 29/588
5,146,310 A * 9/1992 Bayan et al. .................. 357/70
5,822,848 A * 10/1998 Chiang ......................... 29/827

* cited by examiner

Primary Examiner—Leo P. Picard
Assistant Examiner—Michael Datskovsky
(74) Attorney, Agent, or Firm—Reed Smith Shaw & McClay LLP

(57) ABSTRACT

A lead frame apparatus that includes: an arrangement for dissipating heat generated at the lead frame, wherein the heat dissipating arrangement is uninterruptedly connected to the lead frame. Also contemplated herein are a lead frame heat dissipating apparatus having at least one element for dissipating heat generated at a lead frame and having an arrangement for directly and uninterruptedly connecting with a lead frame, as well as lead frame apparatus comprising an arrangement for directly and uninterruptedly accommodating at least one external element for dissipating heat generated at the lead frame. A method of making a lead frame apparatus involves the provision of a lead frame, the provision of an arrangement for dissipating heat generated at the lead frame, and the uninterrupted connection of the heat dissipating arrangement to the lead frame. A lead frame apparatus is also contemplated in which an arrangement for mechanically connecting a lead frame with a heat dissipating arrangement consists essentially of constituent portions of the lead frame and the heat dissipating apparatus.

9 Claims, 3 Drawing Sheets

HEAT DISSIPATION IN LEAD FRAMES

FIELD OF THE INVENTION

The present invention relates to the packaging of integrated circuit dies and, more particularly, to heat dissipation in lead frames.

BACKGROUND OF THE INVENTION

Very similar processes are utilized to manufacture a large variety of integrated circuit packages or chips. A starting substrate, e.g., a thin wafer of silicon or gallium arsenide, is masked, etched and doped during several process steps, with the type, number and order of the steps depending on the type of integrated circuit being manufactured, to form a number of dies or separate integrated circuits thereon. The dies are singulated or separated with a wafer saw and then packaged individually to form integrated circuit packages or chips.

Each die typically has a back that is devoid of circuitry and a front having integrated circuitry formed thereon. The integrated circuitry is accessible via die wire bonding pads that may be arranged in a variety of configurations on the face or edges of the die.

During the packaging process, each die is attached to a corresponding lead frame. The lead frames are processed in groups, typically in strips or in a continuous coil form. Each strip contains multiple, e.g., six, lead frames and is several, e.g., nine, inches long. A coil contains a larger number of lead frames because it is a much longer continuous strip of material. Each lead frame strip or coil typically is a metal frame designed to support several dies for packaging and to provide the leads for the final integrated circuit package.

A typical lead frame strip or coil is produced from metal sheet stock, e.g., a copper or nickel alloy, by subjecting the sheet stock to a stamping or photochemical etch process to form lead fingers, and side rails having pilot holes therein. The side rails and pilot holes therein facilitate transport and indexing of the lead frame strip or coil by automated packaging machinery. For example, a lead frame strip, individually, or a lead frame coil, as a whole, can be removably clipped to carrier belts that move the lead frame strip or coil through the various manufacturing stages.

Each lead frame has a plurality of lead fingers for connection to the die bonding pads. The lead fingers typically are spot plated with palladium, gold or silver. The conductive leads are plated to provide a metallic surface to which wires may be bonded, as a bond wire usually will not stick directly to lead frame material, such as copper or nickel or alloys thereof.

As the demand for thinner packages increases, it becomes desirable to make the die-lead frame assembly thinner, which can be accomplished by reducing the thickness of the lead frame. However, thinner lead frames exacerbate the problems of heat dissipation both during manufacture and use. Particularly, thinner lead frames will, in the absence of other modifications, be less capable of dissipating the tremendous amount of heat that might build up either during manufacture or during operation.

Problems of heat dissipation have also been encountered in view of increased power demands in the context of integrated circuit packages or chips. Particularly, as integrated circuit packages and chips are increasingly used in operating environments that notably increase the power provided thereto, the need for efficient and effective heat dissipation becomes more and more apparent.

To attend to the task of heat dissipation, manufacturers often provide supplementary media for dissipating heat away from the lead fingers. These supplementary media have often taken the form of small metal elements that are connected to portions of a lead frame.

Conventionally, this attachment is often achieved by using small rivets or tappets to interconnect a portion of a lead frame with the heat dissipating element. However, many disadvantages have been encountered with such an arrangement. Particularly, the use of separate interconnecting members, for the purpose of attaching a heat dissipating element to the lead frame, results in extra components that require undesirable additional expenditures of materials and cost.

It is also known to impart a significant thickness to the heat dissipating element in order to increase heat dissipation capabilities. However, by imparting a significant thickness to a heat dissipating element, limitations are subsequently placed on the overall thickness of the integrated circuit package or chip being manufactured.

Generally, the ends of lead fingers, when juxtaposed adjacent to one another, form the outline of a square or other rectilinear shape which might or might not be occupied by additional material. One type of conventional heat dissipating arrangement involves the placement of a quantity of thermally conductive material within this rectilinear space, along with thermally conductive connections to the siderails or other conducting portions of the lead frame. However, since the areal extent of such a heat dissipation arrangement is limited by the dimensions of the rectilinear space, it is often the case that only a significantly small heat dissipating element is realizable, with the result that heat dissipating capabilities may not be as great as desired.

SUMMARY OF THE INVENTION

The present invention broadly contemplates, in accordance with at least one presently preferred embodiment, a lead frame apparatus comprising: a lead frame; and an arrangement for dissipating heat generated at the lead frame, the heat dissipating arrangement being uninterruptedly connected to the lead frame.

In accordance with another presently preferred embodiment, the present invention broadly contemplates lead frame heat dissipating apparatus comprising at least one element for dissipating heat generated at a lead frame, the at least one element comprising an arrangement for directly and uninterruptedly connecting with a lead frame.

In accordance with another presently preferred embodiment, the present invention broadly contemplates lead frame apparatus comprising an arrangement for directly and uninterruptedly accommodating at least one external element for dissipating heat generated at the lead frame.

In accordance with yet another presently preferred embodiment, the present invention broadly contemplates a method of making lead frame apparatus, the method comprising the steps of: providing a lead frame; providing an arrangement for dissipating heat generated at the lead frame; and uninterruptedly connecting the heat dissipating arrangement to the lead frame.

Finally, in accordance with yet another presently preferred embodiment, the present invention broadly contemplates lead frame apparatus comprising: a lead frame; an arrangement for dissipating heat generated at the lead frame; and an arrangement for mechanically connecting the lead frame with the heat dissipating arrangement; the connecting arrangement consisting essentially of constituent portions of the lead frame and the heat dissipating apparatus.

DESCRIPTION OF THE PREFERRED EMBODIMENT

Figure 1:
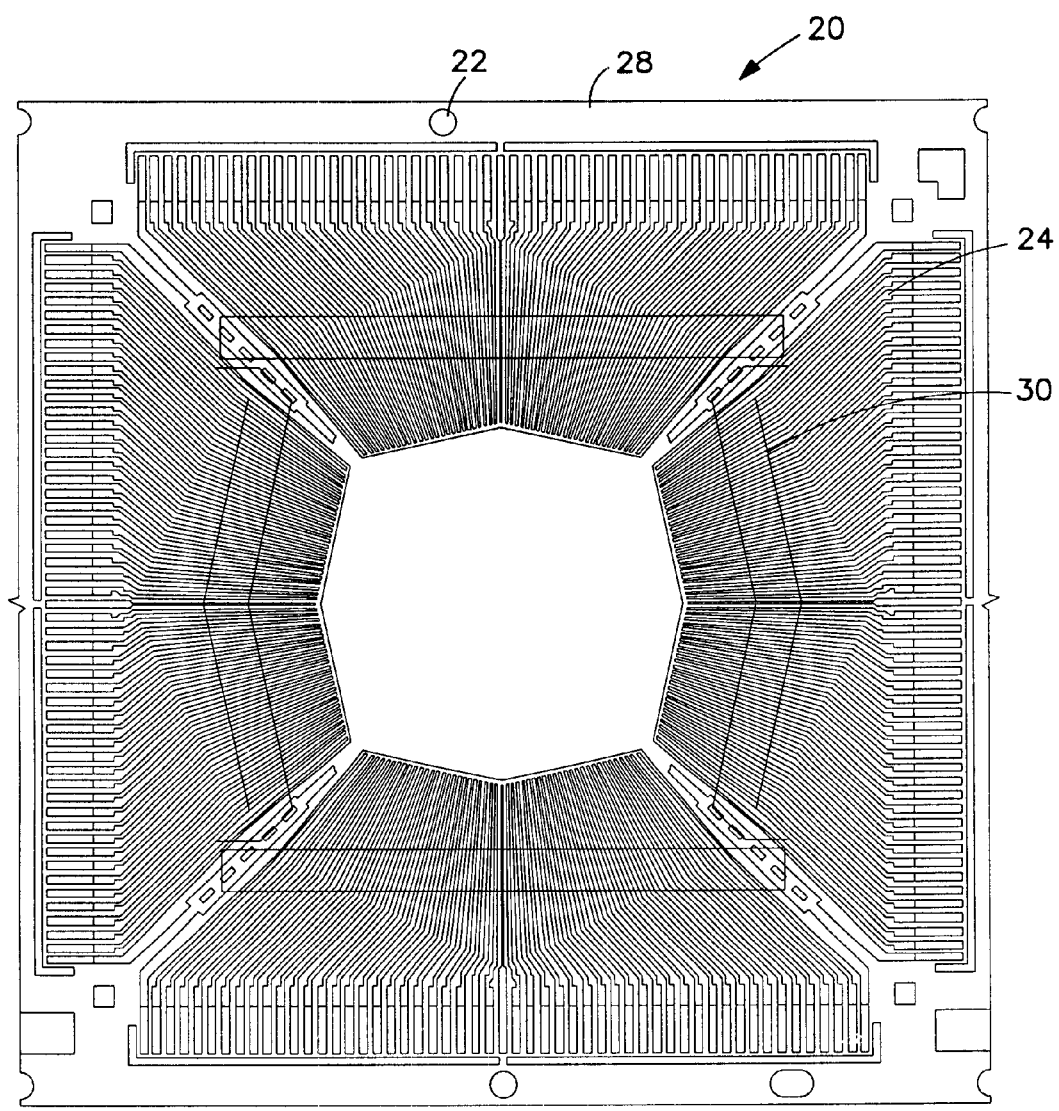
FIG. 1 is a plan view of a conventional lead frame.
Figure 2:
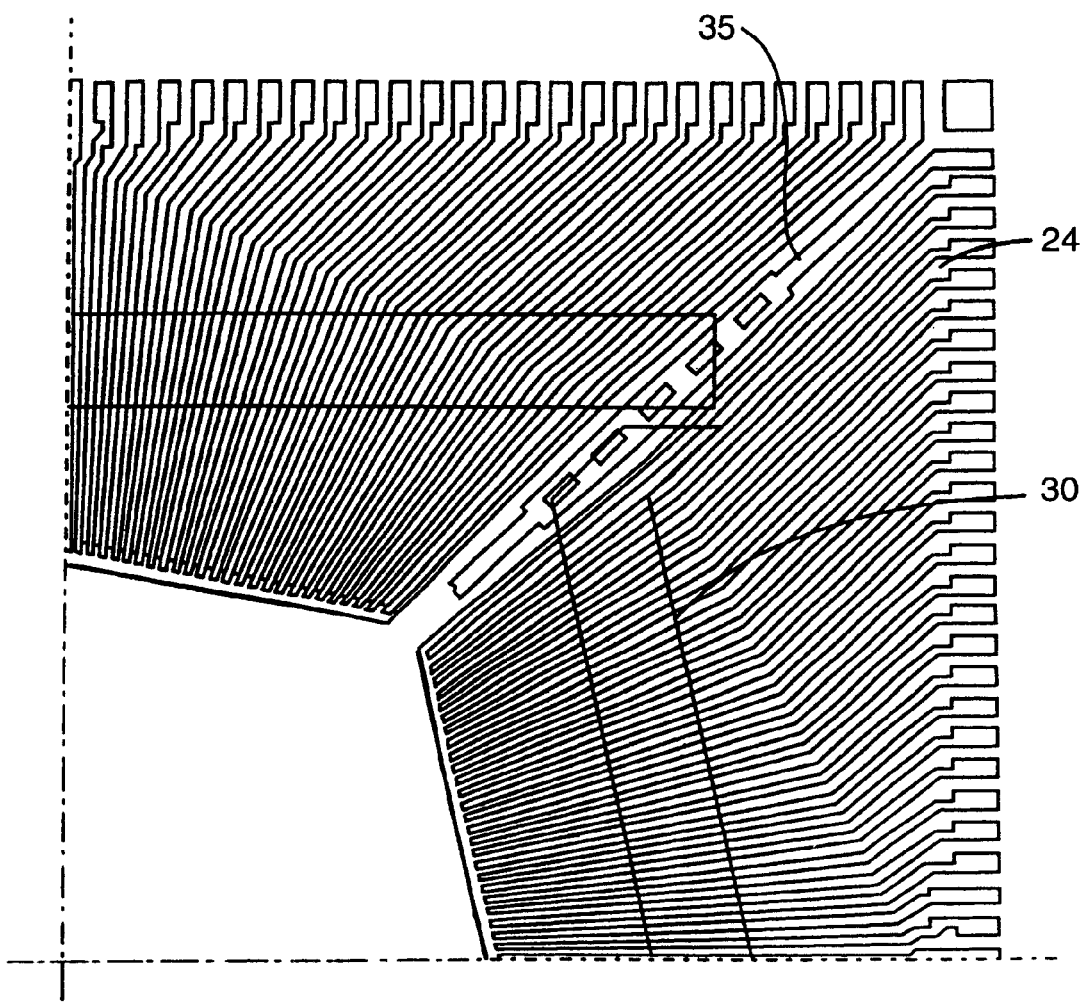
FIG. 2 is an enlarged plan view of a section of the lead frame depicted in FIG. 1.

Referring to FIGS. 1 and 2, a plan view of a lead frame 20, which is part of a lead frame strip or coil, is depicted. Lead frame 20 includes lead fingers 24, side rails 28 and pilot holes 22 in side rails 28. The lead frame design depicted is only one of an endless variety of lead frame designs that are used in practice, depending both on the type of integrated circuit die to be encapsulated and on the package design to be utilized.

Also shown are four conventional lead finger immobilization devices 30 that have been applied close to the ends of lead fingers 24 to immobilize them so as to avoid well-known hazards of lead movement.

The thickness, width and length of lead frames vary greatly, as do the shape, size and location of the lead fingers formed therein. The present invention can be applied beneficially to lead frames of all thicknesses and lead fingers of all widths and lengths. Typically, the thickness of the lead frame may be approximately 0.004 to 0.01 inches, e.g., 0.008 inches; the width of each lead finger may be approximately 0.004 to 0.06 inches, e.g., 0.005 inches; and the length of each lead finger may be approximately 0.2 to 1.25 inches, e.g., 0.300 to 0.400 inches.

Inasmuch as FIG. 2 is a close-up view of a portion of the lead frame shown in FIG. 1, depicted in FIG. 2 is a thermally conductive extension finger 35 originating from a corner of the frame. In accordance with a preferred embodiment of the present invention, this extension finger 35, among others, will preferably serve as a basis for directly and uninterruptedly connecting with a heat dissipation arrangement.

In a presently preferred embodiment of the present invention, it will be appreciated that what is contemplated is a lead frame arrangement, such as the lead frame 20 shown in FIGS. 1 and 2, that is capable of directly and uninterruptedly accommodating at least one external element that itself is capable of dissipating heat generated at the lead frame 20. Such external elements could, of course, be embodied by a heat dissipating arrangement 40 such as that illustrated below in FIG. 3. However, other types of external elements are of course conceivable, and it will be appreciated that an appropriately configured lead frame may be capable of accommodating a wide range of external elements for dissipating heat.

Figure 3:
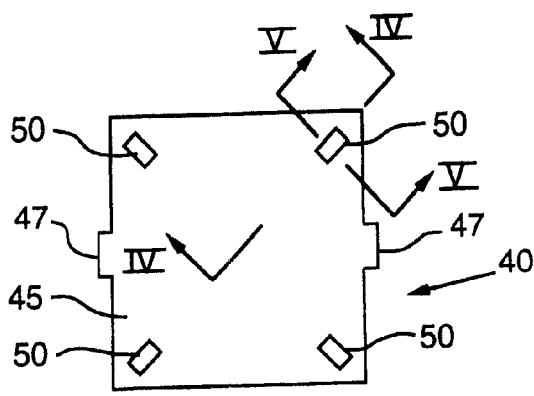
FIG. 3 is a plan view of a heat dissipation element.

FIG. 3 is a plan view of a heat dissipation arrangement 40 according to an embodiment of the present invention. As shown, the heat dissipation arrangement 40 preferably includes a plate 45 of thermally conductive material as well as a number of holes or slots 50 distributed therein. In at least one presently preferred embodiment of the present invention, what is contemplated is a singular heat dissipating arrangement, such as the arrangement 40 illustrated in FIG. 3, that, although initially separate from a lead frame, is configured for directly and uninterruptedly connecting with a lead frame.

In accordance with a presently preferred embodiment of the present invention, a heat dissipating arrangement, such as that indicated at 40 in FIG. 3, can be connected to the lead frame via a crimping operation to be described more fully herebelow.

Figure 4:
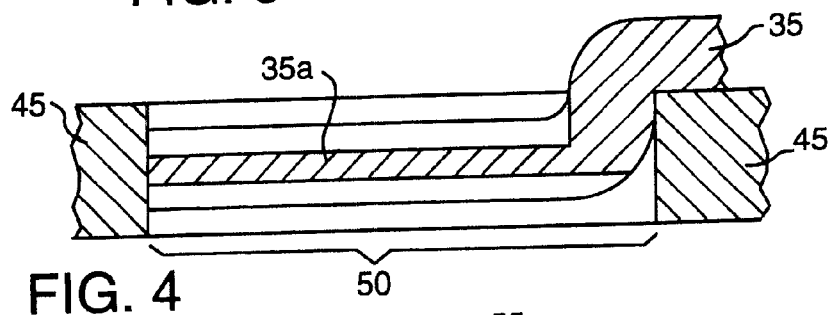
FIG. 4 is a cross-sectional view taken along the line IV—IV in FIG. 3.

FIG. 4 shows the placement of part of an extension finger 35 (see FIG. 2) into one of the holes 50. Preferably, extension finger 35 will have a minor flange portion 35a suitably configured and arranged to fit into hole 50.

Figure 5:
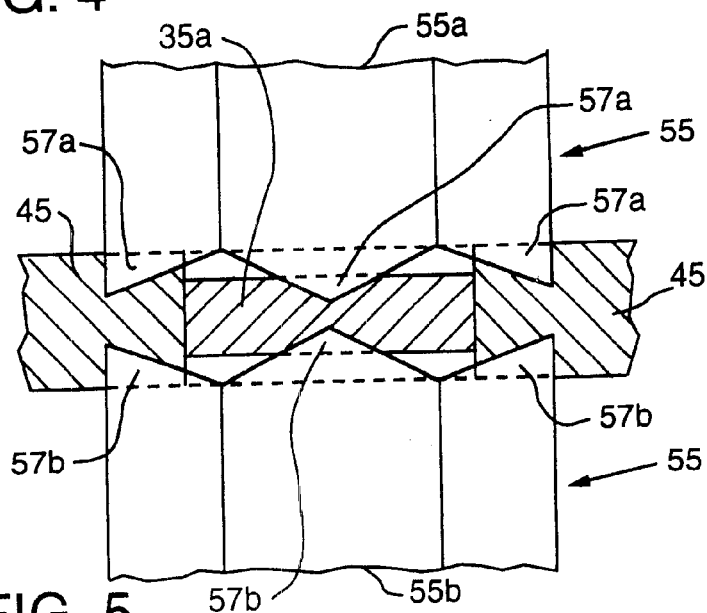
FIG. 5 is a cross-sectional view taken along line V—V in FIG. 3, showing the use of a crimping tool, but prior to deformation.

FIG. 5 illustrates the impingement of a tool 55, having upper and lower portions 55a and 55b respectively, onto the combination of flange 35a and heat dissipation plate 45. In accordance with a preferred embodiment of the present invention, shown in FIG. 5 is a first, intermediate stage of impingement of tool 55 onto the juxtaposed extension finger flange 35a and heat dissipation plate 45.

Figure 6:
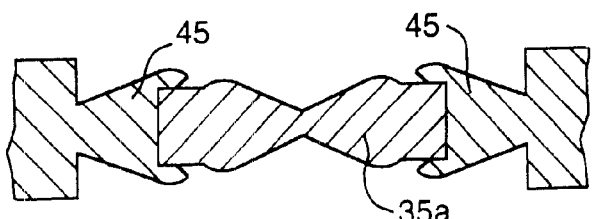
FIG. 6 is substantially the same view as FIG. 5 but illustrating the apparatus subsequent to deformation.

FIG. 6 illustrates the combination of extension finger flange 35a and heat dissipation plate 45 subsequent to a deformation process.

It will be appreciated that essentially any suitable tool may be used in order to effect the deformation pattern shown in FIGS. 5 and 6. However, in accordance with a preferred embodiment of the present invention, it has been found that the tool described and illustrated herein (especially as shown in FIG. 5) yields favorable results in terms of the strength and durability of the resulting connection.

It will be appreciated that, in accordance with at least one presently preferred embodiment of the present invention, in order to effect a connection between a lead frame and a heat dissipation arrangement, essentially only two distinct components are necessary for realizing the connection, these being the heat dissipation arrangement and the lead frame themselves. In other words, no third supplementary component, such as a rivet or stake, is necessary.

In accordance with a presently preferred embodiment of the present invention, a preferred crimping process, involving the mechanical deformation of at least one of the heat dissipation arrangement 40 and the lead frame 20 with respect to the other of the pair can be realized by way of the tool indicated generally at 55 in FIG. 5. The tool can preferably include at least one tooth that itself is capable of mechanically deforming at least a portion of either or both of the lead frame 20 and the heat dissipation arrangement 40.

Preferably, as illustrated in FIG. 5, the tool 55 will include two mutually opposing portions 55a and 55b, wherein each of these portions may include at least one tooth. As shown, during a preferred crimping process, either or both of the heat dissipating arrangement 40 and the lead frame 20 may be interposed between these mutually opposing portions 55a and 55b.

Although, in FIG. 5, each portion 55a and 55b is illustrated as having, respectively, three teeth 57a or 57b, it is conceivable to use different numbers of teeth than illustrated. It is even conceivable to use only one tooth that will be. suitably configured to perform a crimping operation that is capable of establishing a suitable thermally conductive connection between lead frame 20 and heat dissipation arrangement 40.

It will be appreciated that, that in accordance with a presently preferred embodiment of the present invention, the tooth or teeth belonging to each of the mutually opposing portions 55a, 55b of tool 55 will preferably be out of mesh with the tooth or teeth on the opposite portion. In this manner, significant plastic deformation of either or both of lead frame 20 and heat dissipation arrangement 40 can occur in order to achieve a firm connection between the two (such as illustrated in FIG. 6).

Other types of connecting schemes between lead frame 20 and heat dissipation arrangement 40, such as form-locking arrangements, are conceivable. As one non-restricable example, a flange portion 35a of a lead frame extension 35 can extend through a hole or aperture 50 of a dissipator 40, but may be configured in such a manner as to "hook" at the opposite side of the hole from which it originally extends. In this manner, a firm form-locking connection can be achieved.

Further, various types of force-locking connections are conceivable. Particularly, any arrangement is conceivable in which material from the lead frame, such as a flange 35a of a lead frame extension 35, is force-fit with respect to an aperture or even recess of a heat dissipation arrangement 40. In the case of a recess, it is conceivable for there not to even be a hole going all the way through a plate 45, but simply a region of recessed depth (such as an indentation) which may accommodate a portion of a lead frame in a force-fit manner.

Of course, hybrid combinations of force-fit and form-fit connections are conceivable within the scope of the present invention. It is possible that the specific configuration illustrated in FIG. 6 may be considered such a hybrid arrangement.

It will also thus be appreciated that the present invention broadly contemplates essentially any method of connecting a lead frame arrangement with a heat dissipating arrangement in which at least a portion of the lead frame is caused to form-lock with respect to at least a portion of a heat dissipation arrangement 45 in order to achieve a firm thermally conductive connection between the two components.

Likewise, it will also be appreciated that the present invention broadly contemplates essentially any method of connecting a lead frame arrangement with a heat dissipating arrangement in which at least a portion of the lead frame is caused to force-lock with respect to at least a portion of a heat dissipation arrangement 45 in order to achieve a firm thermally conductive connection between the two components.

Although the preferred embodiment described and illustrated hereinabove makes specific reference to a generally rectilinear heat dissipation plate with four holes (thereby resulting in four connections with a lead frame), it will be appreciated that other configurations are possible within the scope of the present invention. Particularly, it is possible to utilize heat dissipation elements having shapes other than a rectilinear shape, such as a circle, hexagon, octagon, or other shapes capable of dissipating heat in a similar manner. Further, it might not be necessary to utilize four connection points as shown and described hereinabove. Thus, it is conceivable, for example, to utilize three such connection points or as little as one or two. On the other hand, it is conceivable to optionally utilize more than four connection points, such as five, six, seven or eight or more. Although not necessary, it might be desirable, in accordance with a preferred embodiment of the present invention, to distribute the connections contemplated herein (regardless of their number) relatively evenly about the periphery of the heat dissipation arrangement being used. Thus, in the preferred embodiment described and illustrated herein, it will be appreciated that the four connection points have each been placed at a corresponding corner of the rectilinearly shaped heat dissipation plate 45.

It will appreciated that at least one presently preferred embodiment of the present invention broadly contemplates an arrangement in which a heat dissipation arrangement is uninterruptedly connected to a lead frame apparatus. Particularly, in addition to the specific embodiment described and illustrated hereinabove, essentially any suitable arrangement for achieving such an uninterrupted connection is conceivable.

It will be appreciated that, in accordance with at least one presently preferred embodiment of the present invention, whereas the ends of lead fingers 24 of a lead frame 20 will likely form an aperture of the lead frame, the heat dissipating arrangement 40 will have a greater two-dimensional surface area than the area defined by the aperture. This would appear to provide a significant difference with respect to those conventional arrangements in which heat dissipators or heat sinks are essentially confined to the two-dimensional area defined by the ends of the lead fingers.

Finally, it will be appreciated that, in accordance with at least one presently preferred embodiment of the present invention, a lead frame arrangement is contemplated in which an arrangement for mechanically connecting a lead frame with a heat dissipating arrangement consists essentially of constituent portions of the lead frame and the heat dissipating arrangement. Although a specific example has been described heretofore with reference to FIGS. 1–6, it will be appreciated that a wide variety of other possibilities are conceivable. Essentially, the present invention broadly contemplates any arrangement in which constituent (i.e., integral) portions of each of the two major components (i.e., the lead frame 20 and the heat dissipating arrangement 40) have constituent portions that serve as the sole media for maintaining a thermally conductive connection between the two. Thus, although a preferred embodiment has been described and illustrated herein, essentially any other equivalent arrangement is conceivable, providing, at least in accordance with this particular presently preferred embodiment of the present invention, that the connection involves no components other than constituent portions of a lead frame 20 and a heat dissipating arrangement 40.

If not otherwise stated herein, it is to be understood that the term "heat dissipator" and "heat dissipation" may be considered as being interchangeable with the terms "heat spreader", "heat spreading", "heat sink" and "heat sinking".

If not otherwise stated herein, it is to be understood that the terms "crimping", "crimping operation", and "crimping process" and the like may be representative of a process that involves at least the plastic deformation and reshaping of one or more components via a suitable tool.

Although the presently preferred embodiments of the invention have been described in the context of a particular lead frame design, the present invention could be utilized in conjunction with a multitude of other types of lead frame designs. Although we have. illustrated and described a present preferred embodiment of the invention and variations thereon, the invention is not limited thereto but may be embodied otherwise within the scope of the following claims.

What is claimed is:

1. A lead frame apparatus comprising:
   a lead frame comprising:
      a main frame portion and an aperture in said main frame portion;

a plurality of lead fingers extending inwardly from said main frame portion, each said lead finger having at least one free end, said free ends of said lead fingers combining to define an aperture of said lead frame; and at least one extension, distinct from said lead fingers, extending inwardly from said main frame portion into said aperture;

an element for dissipating heat generated at said lead frame, said heat dissipating element being permanently connected to said at least one extension of said lead frame such that said head dissipating element is removable from said at least one extension of said lead frame only upon the application of a substantial force at the connection between said heat dissipating element and said at least one extension of said lead frame; and said heat dissipating element comprising at least one throughhole accommodating said at least one extension of said lead frame.

2. The apparatus according to claim 1, wherein said at least one extension is form-locked with respect to said at least one hole in order to achieve said connection.

3. The apparatus according to claim 1, wherein said at least one extension is force-locked with respect to said at least one hole in order to achieve said connection.

4. The apparatus according to claim 1, wherein said heat dissipating element and said at least one extension of said lead frame are connected to one another via crimping at said at least one throughhole.

5. The apparatus according to claim 4, wherein at least one of: said heat dissipating element and said at least one extension of said lead frame is mechanically deformed with respect to the other of: said heat dissipating element and said at least one extension of said lead frame.

6. The apparatus according to claim 5, wherein said at least one hole and said at least one extension constitute the sole media of connection between said heat dissipating element and said at least one extension of said lead frame.

7. The apparatus according to claim 1, wherein at least one of: said heat dissipating element and said at least one extension of said lead frame is mechanically deformed with respect to the other of: said heat dissipating element and said at least one extension of said lead frame.

8. The apparatus according to claim 1, wherein said aperture is essentially square in shape and said at least one extension comprises four extensions each extending towards a corresponding corner of said aperture.

9. The apparatus according to claim 1, wherein said lead fingers extend further inwardly than said at least one extension.

* * * * *

UNITED STATES PATENT AND TRADEMARK OFFICE
CERTIFICATE OF CORRECTION

PATENT NO. : 6,400,569 B1
DATED : June 4, 2002
INVENTOR(S) : Carl Auer

It is certified that error appears in the above-identified patent and that said Letters Patent is hereby corrected as shown below:

<u>Column 7,</u>
Line 12, delete "head" and replace with -- heat --.

Signed and Sealed this

Eleventh Day of February, 2003

JAMES E. ROGAN
*Director of the United States Patent and Trademark Office*